(12) United States Patent
Kiridena et al.

(10) Patent No.: US 9,070,298 B2
(45) Date of Patent: Jun. 30, 2015

(54) RECONFIGURABLE VEHICLE MODEL

(75) Inventors: Vijitha Senaka Kiridena, Ann Arbor, MI (US); Ksenia Kozak, Ann Arbor, MI (US); Nanxin Wang, Novi, MI (US); Jeffrey Allen Greenberg, Ann Arbor, MI (US); Gary Steven Strumolo, Beverly Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1282 days.

(21) Appl. No.: 11/839,194

(22) Filed: Aug. 15, 2007

(65) Prior Publication Data

US 2009/0048742 A1    Feb. 19, 2009

(51) Int. Cl.
| G09B 9/042 | (2006.01) |
| G09B 9/05 | (2006.01) |
| B62D 63/02 | (2006.01) |
| B62D 65/14 | (2006.01) |

(52) U.S. Cl.
CPC ...... *G09B 9/05* (2013.01); *B62D 63/02* (2013.01); *G09B 9/042* (2013.01); *B62D 65/14* (2013.01)

(58) Field of Classification Search
CPC ............ G09B 9/00; G09B 9/04; G09B 9/042; G09B 9/05; G09B 25/00; G01M 99/001; G01M 17/00; B62D 65/00; B62D 65/02; B62D 65/14; B60N 2/00–2205/50; B60R 2300/80; B60R 2300/8006
USPC .......... 701/36, 49; 296/63, 64, 65.01, 187.01, 296/190.01, 190.08, 193.01, 193.04, 296/193.07; 434/62, 65, 66, 67, 373; 703/8
See application file for complete search history.

(56) References Cited

U.S. PATENT DOCUMENTS

| 5,237,250 | A | 8/1993 | Zeile et al. |
| 5,384,704 | A | 1/1995 | Snyder et al. |
| 5,732,912 | A * | 3/1998 | Nomura et al. ............ 248/187.1 |
| 5,774,969 | A | 7/1998 | Zuccato |
| 6,324,750 | B1 * | 12/2001 | Saunders et al. ................. 29/721 |
| 6,371,766 | B1 * | 4/2002 | Doll et al. ...................... 434/373 |
| 6,760,693 | B1 | 7/2004 | Singh et al. |
| 7,079,114 | B1 | 7/2006 | Smith et al. |
| 7,295,959 | B2 | 11/2007 | Noma et al. |
| 2003/0011561 | A1 | 1/2003 | Stewart et al. |
| 2003/0055674 | A1 | 3/2003 | Nishiyama |
| 2003/0132968 | A1 | 7/2003 | Stewart et al. |
| 2004/0148145 | A1 | 7/2004 | Chen et al. |

(Continued)

OTHER PUBLICATIONS

Ait El Menceur et al., "An Experimental Protocol to Study the Car Ingress/Egress Movement for Elderly and Pathological Population," Sep. 2006, European Annual Conference on Human Decision-Making and Manual Control.*

(Continued)

*Primary Examiner* — Spencer Patton
(74) *Attorney, Agent, or Firm* — Damian Porcari; Brooks Kushman P.C.

(57) ABSTRACT

In one embodiment, a vehicle model is disclosed. The vehicle model includes a main vehicle module including a primary base and a number of components. The number of main vehicle module components is moveably mounted to the main vehicle module primary base. The vehicle model also includes a secondary vehicle module including a number of components. The main vehicle module and secondary vehicle modules are relatively positionable relative to one another to obtain a first and second vehicle configuration. The first and second vehicle configurations are different from each other.

17 Claims, 5 Drawing Sheets

(56) References Cited

U.S. PATENT DOCUMENTS

| | | | |
|---|---|---|---|
| 2005/0096885 A1 | 5/2005 | Rhodes et al. | |
| 2005/0200623 A1 | 9/2005 | Smith et al. | |
| 2005/0238452 A1* | 10/2005 | Botos et al. | 409/235 |
| 2006/0025983 A1 | 2/2006 | Arbitter et al. | |
| 2006/0038812 A1 | 2/2006 | Warn et al. | |
| 2006/0038832 A1 | 2/2006 | Smith et al. | |
| 2006/0145514 A1* | 7/2006 | Cardwell et al. | 296/162 |
| 2006/0155402 A1 | 7/2006 | Read | |
| 2007/0156317 A1* | 7/2007 | Breed | 701/45 |
| 2007/0205573 A1* | 9/2007 | Hallmark | 280/163 |

OTHER PUBLICATIONS

Giacomin, et al., "An analysis of human comfort when entering and exiting the rear seat of an automobile," 1997, Elsevier Science Ltd., Applied Ergonomics vol. 28, No. 5/6, pp. 397-406.*

Calkins, D.E., Egging, N. Scholz, C. and Gomez-Levi, G.: AutoDSS: A System Level KBE Tool for Vehicle Product Definition, SAE 2000-01-1351.

Bhise, V., Kridli G., Mamoola, H., Devaraj, S., Pillari, A., Shulze, R.: Development of a Parametric Model for Advanced Vehicle Design, SAE 2004-01-0381.

Wang, N., Becker, B., and Kaepp, G.: PEDSS: A Product Engineering Decision Support System, Proceedings of IMECE 2000, Florida 2000.

Wang. N., Wan, J., and Gomze-Levi, G.: A Prametric Approach to Vehicle Seating Buck Design, ASME DETC2004-57212.

Wang, N. Wan, J., and Gomze-Levi, G.: Parametric Method for Applications in Vehicle Design, SAE 05B-201, accepted by SAE World Congress, Apr. 2005.

"Motor Vehicle Dimensions", SAE International, Surface Vehicle Recommended Practice, J1100, Revised Jul. 2002, 68 pages.

Aleixos et al., "Integrated Modeling With Top-Down Approach in Subsidiary Industries", Computers in Industry, vol. 53 (2004) pp. 97-116.

* cited by examiner

RECONFIGURABLE VEHICLE MODEL

BACKGROUND

1. Technical Field

One aspect of the present invention generally relates to a reconfigurable vehicle model.

2. Background Art

Vehicle models, otherwise referred to as vehicle bucks, have been utilized to conduct studies into human motion relating to vehicles. A vehicle model generally includes moveable parts that can be adjusted to reflect a variety of vehicle packages. A typical study includes the collection of human motion data related to one or more of the modeled vehicle packages.

For example, a vehicle model can be variably adjusted to conduct research into human motion while entering and exiting a vehicle (otherwise referred to as ingress and egress). Vehicle models can also be configured to conduct other human occupant package research studies, including, but not limited to, roominess, vision and reachability. Vehicle models can also be used to conduct human ergonomics studies.

SUMMARY

According to one embodiment of the present invention, a reconfigurable vehicle model is disclosed that can be utilized to conduct research into human motion while entering and exiting a vehicle (otherwise referred to as ingress and egress). The reconfigurable vehicle model of one or more embodiments of the present invention can also be utilized to conduct other human occupant research studies, such as, but not limited to, interior roominess, vision and reachability. In at least one embodiment, the reconfigurable vehicle model is a quarter vehicle model.

The vehicle model can include a number of vehicle modules detachably mounted to a number of primary bases. Each of the number of vehicle modules may include a number of components supported by the primary base and moveable relative to the primary base. In one embodiment, the number of vehicle modules includes a main module and a secondary module.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompanying drawings which:

FIG. 3b depicts an isolated, top view of a detachable mounting feature according to the embodiment shown in FIG. 3a;

FIG. 5b depicts a cross-sectional side view of the vehicle model footprint of FIG. 5a;

DETAILED DESCRIPTION OF EMBODIMENTS OF THE PRESENT INVENTION

According to one embodiment of the present invention, a reconfigurable vehicle model is disclosed that can be utilized to conduct research into human motion while entering and exiting (otherwise referred to as ingress and egress) a vehicle. The reconfigurable vehicle model of one or more embodiments of the present invention can also be utilized to conduct other human occupant research studies, such as, but not limited to interior roominess, vision and reachability.

The vehicle model can include a number of vehicle modules detachably mounted to a number of primary bases. Each of the number of vehicle modules includes a primary base and a number of components supported by the primary base and moveable relative to the primary base. In one embodiment, the number of vehicle modules includes a main module and a secondary module. In certain embodiments, vehicle components and armatures can be referred to collectively as vehicle components.

Figure 1:
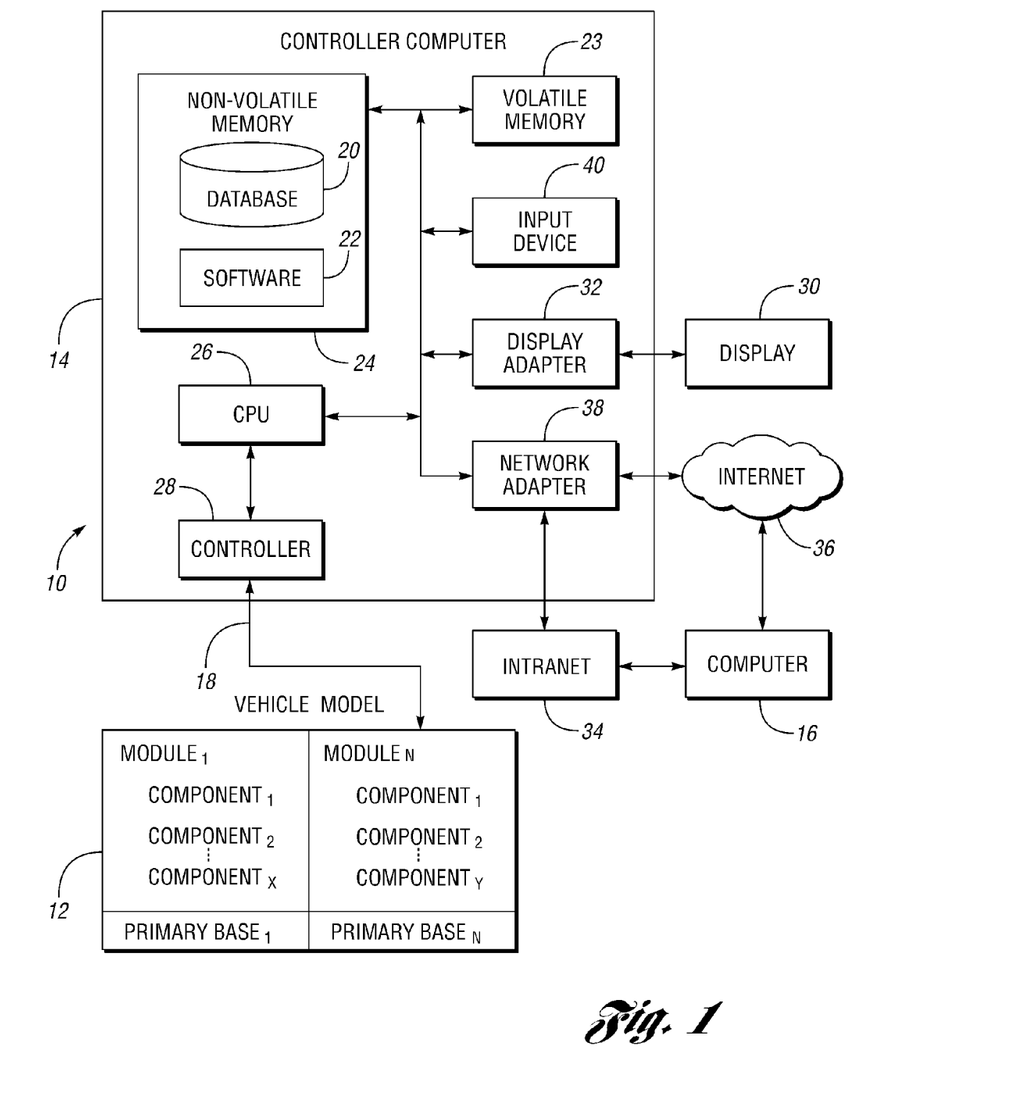
FIG. 1 illustrates a system according to one embodiment of the present invention.

The vehicle model thus described can be implemented in combination with a computer system. One example of such a system is disclosed in FIG. 1. FIG. 1 illustrates a system 10 according to the teachings of one embodiment of the present invention. The system 10 includes a vehicle model 12, a computer system 14, and a computer 16, for example, a computer aided design (CAD) computer.

Vehicle model 12 includes primary $base_1$ through $base_N$ for supporting $module_1$ through $module_N$. Each of the modules includes a set of components, defined as $component_1$, $component_2$ through $component_N$.

The computer system 14 and the vehicle model 12 can be in two-way electrical communication with each other through communication line 18. Software 22 and database 20 are stored in non-volatile memory 24. Software 22 can be configured to generate machine instructions that are stored in volatile memory 23 and executed by central processing unit (CPU) 26. The machine instructions can include instructions for receiving user input for adjusting the position of one or more components of one or more vehicle modules. The CPU 26 transmits instructions to a controller 28 to electronically adjust the positions of the one or more components via a signal transmitted by the controller 28 through communication line 18 to the vehicle model 12. In at least one embodiment, the controller 28 is capable of adjusting the position of each component from the minimum position to the maximum position within 15 seconds. In other embodiments, the minimum position to maximum position adjustment can be achieved within 10 seconds. In at least one embodiment, the controller can achieve positioning of each component within ±1.0 millimeter.

The machine instructions generated by software 22 can include instructions for confirming the achievability of a requested component position and for interference checking that may result from the requested position adjustment. The machine instructions can be configured to prevent the controller 28 from actuating one or more components that may result in unachievable positions or interference between components. Controller computer 14 can receive feedback from vehicle model 12 regarding an adjustment command through communication line 18.

The machine instructions of software 22 can be configured to generate one or more control interfaces for display on the display 30 through display adapter 32. The one or more control interfaces available to a user may depend on the one or more vehicle modules that are detachably mounted to the primary base and electronically coupled to the controller 28 through communication line 18. In at least one embodiment, the machine instructions of software 22 can be configured to automatically or semi-automatically enable and disable the available control interfaces when one or more modules are removed and/or added to the system 10.

The machine instructions of software 22 can be configured to transmit and receive text-based commands from computer 16 through an intranet 34 or the Internet 36 through network adapter 38 of controller computer 14. The machine instructions generated by software 22 can be configured to convert incoming text commands into instructions for adjusting the position of one or more components. The machine instructions of software 22 can also be configured to transmit the results of the position adjustment instructions through network adapter 38 to computer 16. In at least one embodiment, the machine instructions generated by software 22 can be configured to initiate position adjustment commands and to receive a response through communication line 18. In at least one embodiment, the text-based commands are prepared in an extended markup language (XML) format. The text-based commands can be based on CAD data or tessellated data of the positions of one or more components of a vehicle model.

The machine instructions of software 22 can be configured to receive input from a user through input device 40. The input can include a definition of the x, y and z positions of one or more components of the vehicle model 12. These positions can be utilized to adjust the position of the one or more components via controller 28. The machine instructions of software 22 can be configured to receive user instructions for moving one or more components in a uniaxially, i.e. x, y or z, direction.

The database 20 can be configured to store a number of position configurations for one or more of the components of a vehicle model. The machine instructions of software 22 can be configured to generate an interface for display on display 30 for allowing the user to select a desired configuration from the stored configurations and to initiate motion of the vehicle 12 based on the selection.

The database 20 can also be configured to store a database of components, component offsets, component sizes and other dimensions to allow a user to modify the component database when different components and trim panels are used.

The machine instructions of software 22 can be configured to couple the movement of two or more components. The movement of the accelerator and steering wheel can be coupled with the primary seat in the y direction. The movement of front header armature can be coupled to the front side roof rail armature in the x and/or y directions. The movement of the rear side roof rail armature can be coupled to the front side roof rail armature in the y and/or z directions.

Figure 2:
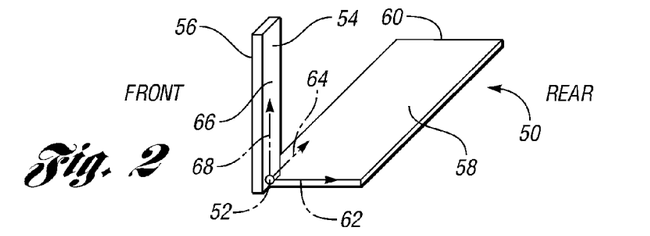
FIG. 2 is an illustration of a datum definition of a vehicle model according to one embodiment of the present invention.

FIG. 2 depicts an illustration 50 of a datum definition of a vehicle model according to one embodiment of the present invention. The datum definition is utilized for the various embodiments of the invention as set forth herein, although other definitions can be utilized without departing from the scope and spirit of the invention. The datum definition is a single datum point 52 positioned at the intersection of the centerline of the rear face 54 of a front pillar armature 56 and the upper face 58 of the primary floor armature 60.

The single datum point 52 can be represented as ($X_0, Y_0, Z_0$). The positive X-axis 62 extends from the datum point 52 towards the rear of the primary floor armature 60. The X-axis 62 can be utilized to position and track the fore and aft movement of the vehicle model. The positive Y-axis 64 extends from the datum point 52 towards the inside of the primary floor armature 60. The Y-axis 64 can be utilized to position and track the lateral movement of the vehicle model. The positive Z-axis 66 extends from the datum point 52 orthogonally from the upper face 58 of the primary floor armature 60. The Z-axis 66 can be utilized to position and track the upward and downward movement of the vehicle model.

Figure 3A:
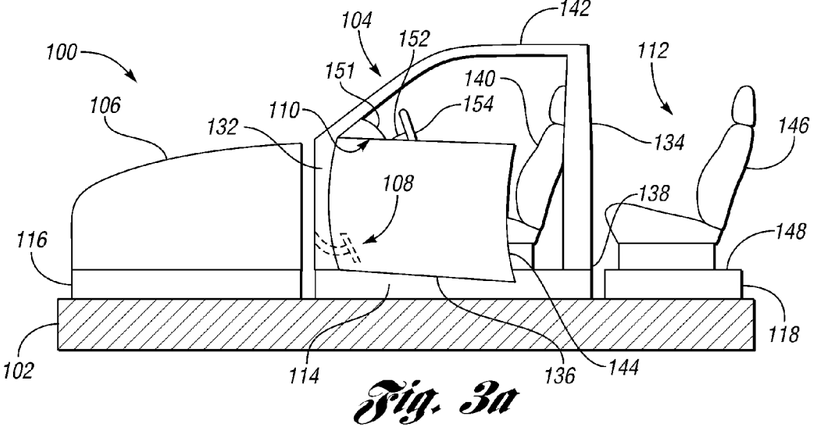
FIG. 3a depicts a side view of a reconfigurable vehicle model according to one embodiment of the present invention.

FIG. 3a depicts a side view of a reconfigurable vehicle model 100 according to one embodiment of the present invention. FIG. 3a illustrates a vehicle model 100 representing a first vehicle row configuration. As shown in FIG. 3a, vehicle model 100 is a quarter vehicle model showing the left side of the first row of a vehicle. It should be appreciated that the embodiments of the present invention can be extended to half-vehicle models and full vehicle models. Moreover, the quarter vehicle model can represent the left and/or right side of the second vehicle row or the left and/or right side of a subsequent vehicle row.

The reconfigurable vehicle model 100 generally includes primary base 102, main module 104 and number of secondary modules including hood module 106, pedal module 108, instrument panel module 110, and secondary seat module 112. Main module 104 includes a primary base portion 114 for supporting the main module 104. Hood module 106 includes a primary base portion 116 for supporting the hood module 106. Secondary seat module 112 includes a primary base portion 118 for supporting the secondary seat module 112. In at least one embodiment, the primary base portions 114, 116 and 118 are detachably mounted to the primary base 102 such that the supported modules 104, 106 and 112 are supported by primary base 102 while being easily detached so that the modules 104, 106 and 112 can be reconfigured to represent various vehicle configurations.

Figure 3B:
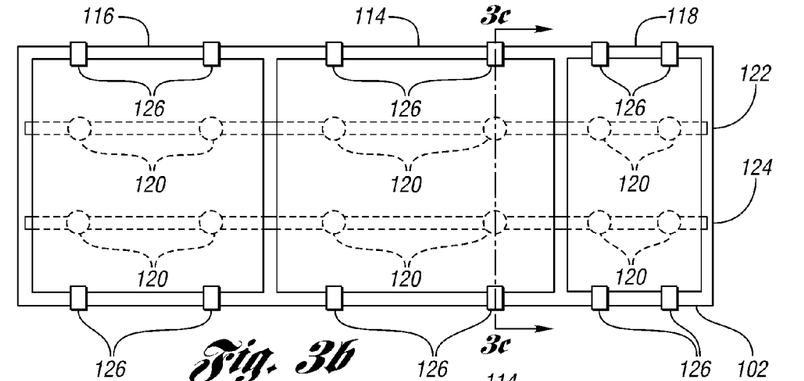
Figure 3C:
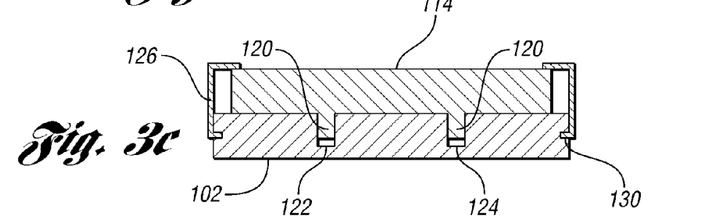
FIG. 3c depicts a cross-sectional side view of the detachable mounting feature shown in FIG. 3b.

FIG. 3b depicts an isolated, top view of the detachable mounting of primary base portions 114, 116 and 118 to the primary base 102 according to one embodiment of the present invention. FIG. 3c depicts a cross-sectional side view of the detachable mounting shown in FIG. 3b. Each of the primary base portions 114, 116 and 118 includes a number of projections 120 extending orthogonally downward from the underside of each of the primary base portions 114, 116 and 118. The projections 120 are slidably engaged by either a first longitudinal groove 122 or a second longitudinal groove 124 formed in the primary base 102. The slidable engagement can be utilized to slide the modules on and off of the primary base 102 to reconfigure the vehicle module into different vehicle configurations.

In at least one embodiment, the detachably mounted primary base portions 114, 116 and 118 are anchored to the primary base 102 such that movement between the primary base and the primary base portions during use of the vehicle model is restricted, or even prevented. As shown in FIG. 3b, a number of clamps 126 are utilized to restrict this relative movement. Each clamp 126 contacts a recess 128 formed in the upper surface of one of the primary base portions 114, 116 and 118 and a recess 128 formed in a lateral side of the primary base 102 such that the primary base portion 114, 116 or 118 is held in place relative to the primary base 102 by the contacting force of the clamp 126. It should be appreciated that this is but one non-limiting example of a feature that can be implemented to restrict or even prevent movement of one or more primary base portions relative to the primary base.

The main module 104 includes a number of vehicle components and/or armatures. As used in certain embodiments of the present invention, the term vehicle armature refers to a skeletal member of a vehicle model and the term vehicle component refers to components of a vehicle, such as a seat or steering wheel, that are typically affixed to one or more vehicles armatures. In at least one embodiment, vehicle components and/or armatures can be referred to as elements. The main module 104 includes front pillar 132, rear pillar 134, door 136, floor 138, primary seat 140, side roof rails 142, sill (not shown), headliner (not shown), and front header 143, and console 141. In at least one embodiment, the top of each of the front and rear pillars and the front and rear ends of the side roof rails include pivot points to which the upper front pillar and the upper rear pillar are attached. In at least one embodiment, universal joints are affixed at one or more of the pivot points. In one embodiment, universal joints are affixed at all four of the pivot points. Each of the joints is configured for rearward and frontward movement and/or in and out movement of two components coupled by the universal joint.

The door 136 includes an armature frame defining a perimeter 144 of the door 136. The door armature frame can be configured to mount one or more panels that represent the interior trim of a door. In at least one embodiment, the door armature frame is adjustable such that the frame can accommodate a change in height of a beltline (i.e. the height of the front and rear pillars) and the fore-aft position of the rear pillar. In at least one embodiment, this adjustment can be made manually. Additionally, the lower perimeter of the door armature frame can be adjusted to avoid interference with the sill. In at least one embodiment, the door 136 is mounted to the front pillar 132 such that the inner face of the door 136 is aligned with the centerline of the front pillar 132.

The armatures and components of the main module 104 can be a made of a steel alloy or other suitable alloy. In at least one embodiment, suitable materials include such materials that can withstand a vertical load of 300 lbf with minimal plastic deformation and controlled elastic deformation.

Figure 4A:
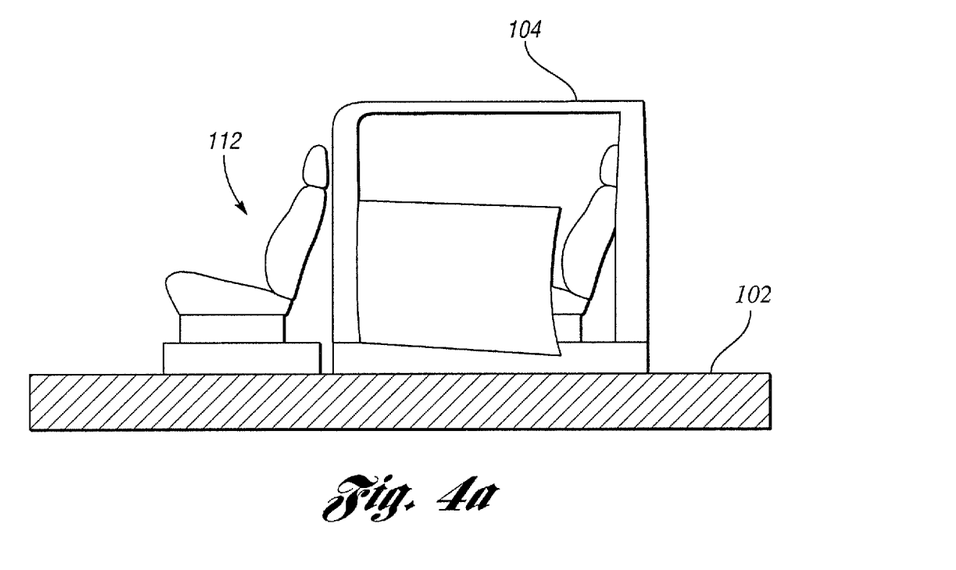
FIG. 4a depicts a side view of a reconfigurable vehicle model according to an embodiment of the present invention.
Figure 4B:
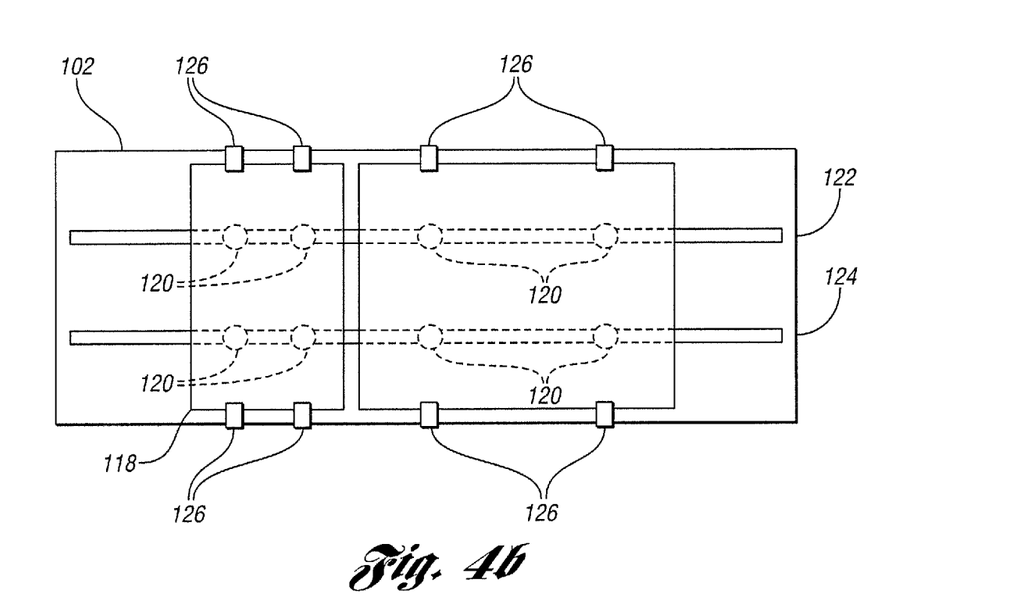
FIG. 4b depicts an isolated, top view of a detachable mounting feature according to the embodiment shown in FIG. 4b.

The secondary seat module 112 includes a seat 146 and a floor 148. The secondary seat module 112 can be detachably mounted to the primary base 102 in front of or to the rear of the main module 104. As depicted in FIG. 4a, the secondary seat module 112 is detachably mounted in front of the main module 104. As depicted in FIG. 3a, the secondary seat module 112 is detachably mounted to the rear of main module 104. According to the configuration shown in FIG. 3a, the secondary seat module 112 represents a second row seat in a two-door vehicle or a third row in a four-door vehicle. According to the configuration shown in FIG. 4a, the secondary seat module 112 represents the first or second row seat and the primary seat 140 represents a second or third row seat, respectively.

The armatures and components of the secondary module 112 can be a made of a steel alloy or other suitable alloy. In at least one embodiment, suitable materials include such materials that can withstand a vertical load of 300 lbf with minimal plastic deformation and controlled elastic deformation.

The instrument panel module 110 includes an instrument panel 151, a steering column 152 and a steering wheel 154. The steering column can be a telescopic steering column. The instrument panel module 110 can be attached to a frontward position within the main module 104. When the instrument panel module 110 is attached to a frontward position within the main module 104, then the main module 104 represents a driver's compartment. In at least one embodiment, the instrument panel module 110 includes an instrument panel armature capable of supporting a full instrument panel.

The pedal module 108 includes an accelerator, brake and clutch. The accelerator may be capable of independent movement in the x, y and z directions and may have the option of being electronically coupled with the movement of the primary seat reference point SgRPy. The movement of the brake and/or accelerator can be coupled to the movement of the accelerator.

The hood module 106 can include a cowl point having motion in the x, y and z directions. In at least one embodiment, the hood angle can be achieved by adjusting the z position of the hood 500 mm from the cowl point in the negative x direction.

In at least one embodiment, the interchangeable modules, i.e. the hood, secondary seat, instrument panel and pedal modules, can be fitted with one or more wheels to facilitate movement and re-configuration. It should be appreciated that other features can be affixed to one or more interchangeable modules to facilitate relatively easy movement and re-configurability.

The seats 140 and 146 can be automotive seats provided by a vendor for integration into the main module 104 and secondary seat module 112, respectively. The primary base portions 114 and 118 can be configured to allow different seats to be easily interchanged without seat-specific mounting fixtures. During ingress/egress testing, the driver actuated seat adjustments remain operational so that the computer system can record feedback regarding the driver selected seat positions.

As shown in FIGS. 3a, 3b, 4a and 4b, the modules are detachably mounted to a primary base. In other embodiments, the ground can support one or more of the modules.

In at least one embodiment, one or more armature elements are formed with a row, rectangular grid or other configuration of holes at a suitable spacing. For example, the hole diameter can be 12 mm and the spacing can be 50 mm. The hole configuration can be utilized to attach one or more panels and/or one or more components to the armature element. According to at least one embodiment, one or more of the armature elements can support trim pieces fabricated from any suitable foam or plastic.

Each of the armature elements can include a reference point, which is represented by a hole on the armature element. Table 1 identifies the reference points of each armature element according to one embodiment of the present invention.

TABLE 1

| Module Name | Armature Or Component | Reference Location Definition |
| --- | --- | --- |
| Main Module | Floor | Point on the top face of the floor armature |
| | Lower front pillar | Point on the rear face in x of front pillar armature, on the centerline in y and offset −100 mm in z from the lower front pillar pivot point |
| | Lower rear pillar | Point on the forward face in x of rear pillar armature, on the centerline in y and offset −100 mm in z from lower rear pillar pivot point |

TABLE 1-continued

| Module Name | Armature Or Component | Reference Location Definition |
|---|---|---|
| | Sill | Point on the top face of the sill armature element, along the centerline of the sill armature element in y |
| | Primary seat | Point on the top face of the armature plate at SgRPx and SgRPy |
| | Console | Point on the center (x&y) of the upper face of the console armature |
| | Door | Point on the inside face or the door frame armature. The inside face (in y) is aligned with the centerline (in y) of front pillar armature element |
| | Ground | Point on the top face of the subject platform |
| | Headliner | Point on the center (x, y) lower face of the headliner armature |
| | Front header | Point in the center (x, y) of the lower face of the header armature |
| | Front of siderail | Intersection point of the centerlines (longitudinal axes) of upper front pillar and side roof rail |
| | Rear of siderail | Intersection point of the centerlines (longitudinal axes) of upper rear pillar and side roof rail |
| Secondary Seat Module | Secondary seat (in front position) | Point on the top face of the armature plate at SgRPx and SgRpy |
| | Secondary rear floor | Point on the top face of the floor armature |
| Pedal Module | Accelerator | Point on the center of the accelerator pedal armature |
| IP Module | IP | Left top reference hole on the IP armature attachment fixture |
| | Steering wheel | Pivot point of steering column |
| | Steering column angle | Steering column center line wrt x axis |
| Hood Module | Cowl point | Point in the center (x, y) of the top face of the cowl armature |
| | Hood | Point −500 mm from cowl in the −x direction along the centerline of the hood in the y direction |

Table 2 provides ranges of movement for each of the armature elements according one embodiment of the present invention. The ranges are defined as absolute dimensions relative to the reference datum 52. For each armature element, a home position can be defined as a position in which no inference occurs between the elements.

TABLE 2

| Module Name | Armature or Component | X (mm) | | Y (mm) | | Z (mm) | |
|---|---|---|---|---|---|---|---|
| | | Min | Max | Min | Max | Min | Max |
| Main Module | Floor | | | | | | |
| | Lower front pillar | | | | | 510 | 770 |
| | Lower rear pillar | 790 | 1920 | | | 510 | 770 |
| | Sill | | | −45 | 120 | −65 | 195 |
| | Primary seat | 495 | 920 | 305 | 575 | −135 | 205 |
| | Console | 335 | 920 | 710 | 955 | −5 | 275 |
| | Door | | | | | | |
| | Ground | | | | | −665 | −110 |
| | Headliner | 670 | 1420 | 400 | 875 | 910 | 2210 |
| | Front header | −130 | 620 | 400 | 875 | 860 | 1560 |
| | Front of siderail | −130 | 620 | 0 | 475 | 870 | 1570 |
| | Rear of siderail | 645 | 2100 | 0 | 475 | 870 | 1570 |
| Secondary Seat Module | Secondary seat (in front position) | −580 | −170 | 285 | 575 | −105 | 240 |
| | Secondary Rear Floor | | | | | −110 | 185 |
| Pedal Module | Accelerator | −275 | −60 | 465 | 650 | 130 | 265 |
| IP Module | IP | −255 | −30 | | | 530 | 680 |
| | Steering Wheel | −135 | 145 | 285 | 595 | 390 | 675 |
| | Steering Column Angle | | | 15 deg | 30 deg | | |
| Hood Module | Cowl point | −585 | −235 | 710 | 955 | 700 | 850 |
| | Hood | | | | | 625 | 905 |

Figure 7:
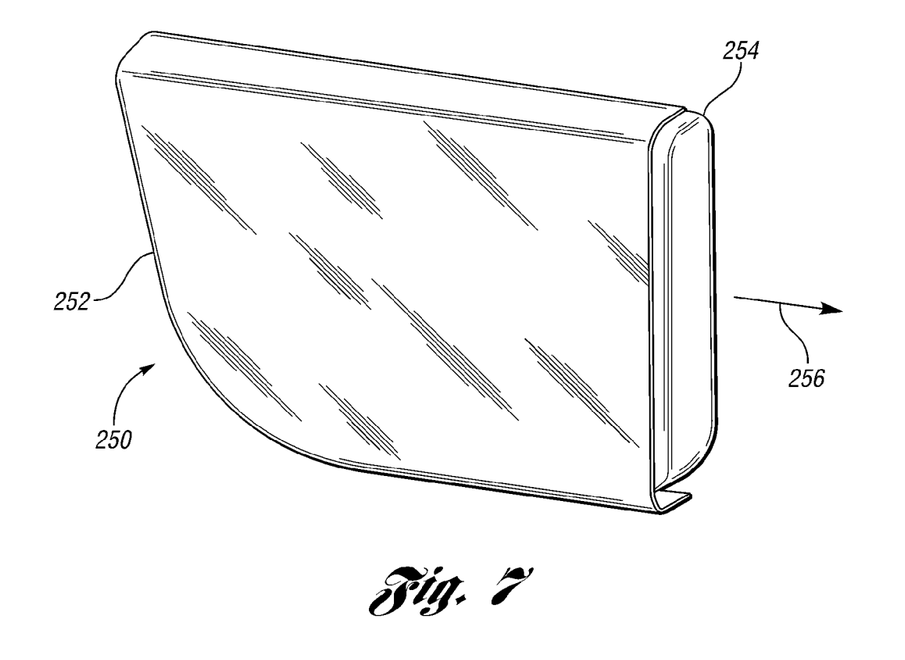
FIG. 7 depicts an example of an overlapping, sliding trim panel according to one embodiment of the present invention.

According to at least one embodiment of the present invention, one or more components can include overlapping trim panels that can slide over each other to conceal a gap caused by the movement of another component. For example, the main module floor panel can include overlapping trim panels to fill gaps created by seat movement in the x and/or y directions and sill movement in the y direction. As another non-limiting example, the secondary floor panel can include overlapping trim panels to fill gaps created by secondary seat movement in the x and/or y directions. As yet another example, the interior door panel can include overlapping trim panels to fill gaps created by the expansion of the door in response to rear pillar movement in the x and z direction (beltline) and/or sill movement in the z direction. Moreover, the front side roof rail trim can include an overlapping trim panel to fill gaps created by the movement on the rear side roof rail in the x direction. Yet another example includes overlapping sill trim that fills gaps created by the movement of the rear pillar armature in the x direction. In at least one embodiment, the gap-filling feature is limited to a range of two times the minimum size of the trim panel. In at least one embodiment, components without overlapping trim panels can be either fixed components or fixed trim panels. FIG. 7 depicts an example of overlapping, sliding door panel 250 including fixed portion 252 and sliding portion 254 that can slide in direction 256 to change the geometry and dimensions of the panel 250.

The locations and ranges of motion for each of the armature elements as identified in Tables 1 and 2 are derived based on vehicle model dimensions including components and panels.

Figure 5A:
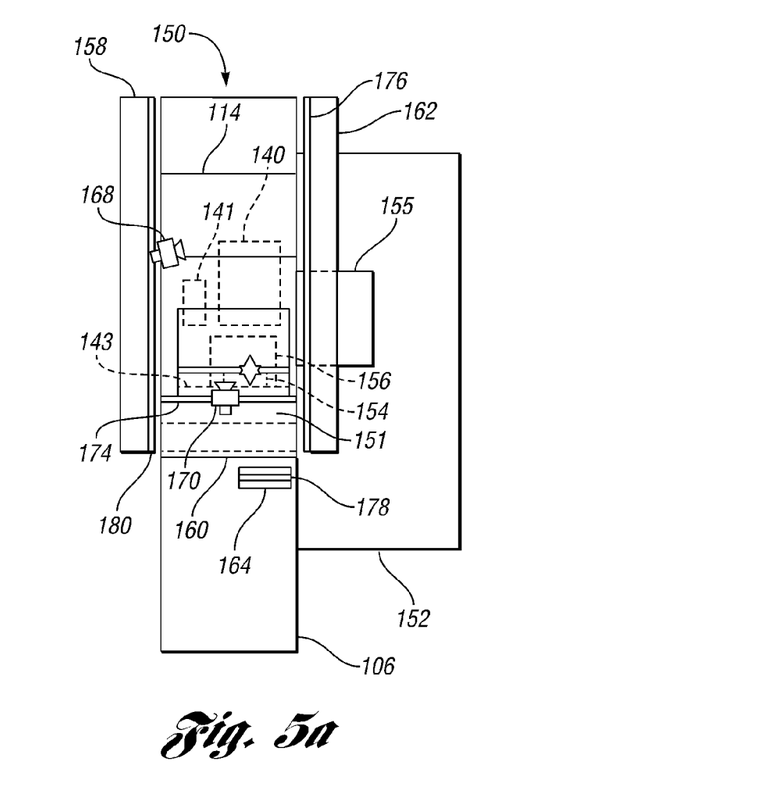
FIG. 5a depicts a top view of a vehicle model footprint according to one embodiment of the present invention.
Figure 5B:
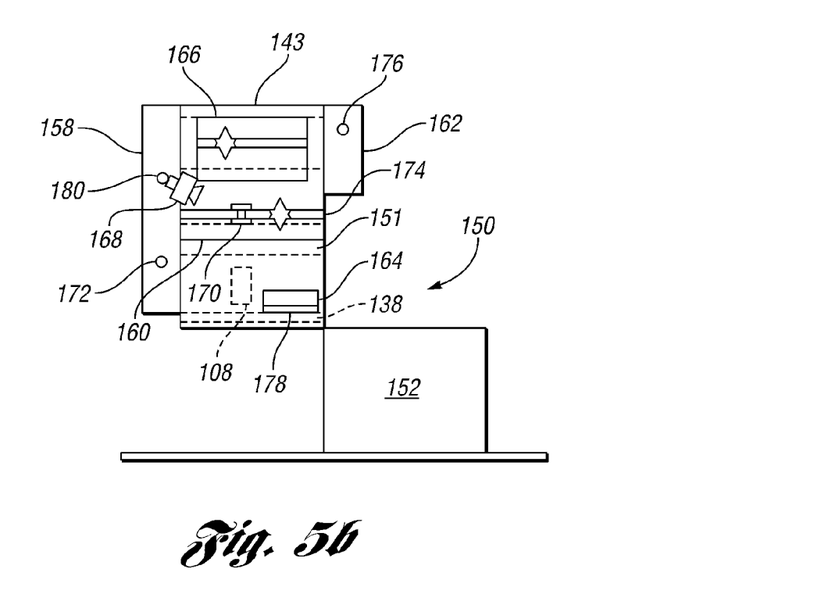

FIG. 5a depicts a top view of a vehicle model footprint 150 according to one embodiment of the present invention. FIG. 5b depicts a cross-sectional side view of the vehicle model footprint 150. The footprint 150 includes a subject platform 152 for simulating the ground outside of the vehicle. The subject platform 152 can include rails (not shown) secured to the upper surface perimeter of the subject platform 152. An adjustable canvas curtain can be utilized to cover the sides of the subject platform 152 or any other pinch points. In at least one embodiment, the subject platform 152 has a load capacity of 1200 lbf with minimal plastic deformation and with controlled elastic deformation. According to one embodiment, the size of the subject platform is 1.2 meters in width and 2.8 meters in length.

The subject platform 152 can include a force platform 155 disposed on a portion of the subject platform 152 adjacent to the door opening of the vehicle model. In at least one embodiment, the subject platform 152 is adjustable based on the human ergonomics study being performed. The subject platform 152 can include a cutout to accommodate the force platform 155. The force platform 155 can be utilized to record the force imparted by an occupant's feet as the occupant enters and exits the vehicle model. The force platform 155 can be custom sized, although in at least one embodiment, the force platform 155 is 500 mm in length, 500 mm in width, 44 mm in height and weighs 11.4 kg.

The main module floor 114 can include a force platform 156 positioned in the area of a footwell. The floor 138 can include a cutout to accommodate the force platform 156 such that the force platform 156 can move with the seat 140 in the x and y directions. The force platform 156 can be utilized to record the force imparted by an occupant's feet as the occupant enters and exits the vehicle model. The force platform 156 can be custom sized. In at least one embodiment, the force platform 156 is movable in the x and y directions in combination with the seat 140.

The secondary seating module floor 148 can include a cutout to accommodate a force platform such that the force platform can move with the seat 140 in the fore and aft directions.

Covers can be utilized to conceal the cutouts in the event that the platforms are removed. In at least one embodiment, a conduit can be formed in a side of the cutout to accommodate a cable connecting the force platform to a control box for the force platform. In at least one embodiment, the conduit has a 25 mm diameter.

According to at least one embodiment, a number of a cameras for capturing the motion of occupants are integrated with the vehicle model. This integration aids in the development of digital human models of ingress and egress motion. The motion capture data and/or the force platform data can be utilized to study the joint torques of occupants and thus the overall effort of entering and exiting the vehicle.

As shown in FIGS. 5a and 5b, a number of camera mounting zones 158, 160, 162, 164 and 166 are defined for receiving one or more camera mounting fixtures and one or more cameras. Mounting zone 158 is positioned adjacent to the right side of the occupant when seated in the vehicle model 100. Mounting zone 160 is positioned in front of the header 143 of the vehicle model 100. Mounting zone 162 is positioned adjacent to the left side of the occupant when seated in the vehicle model 100. Mounting zone 164 is positioned adjacent to the footwell of the main module 104. Mounting zone 166 is positioned above the occupant when seated in the vehicle model 100.

Figure 6:
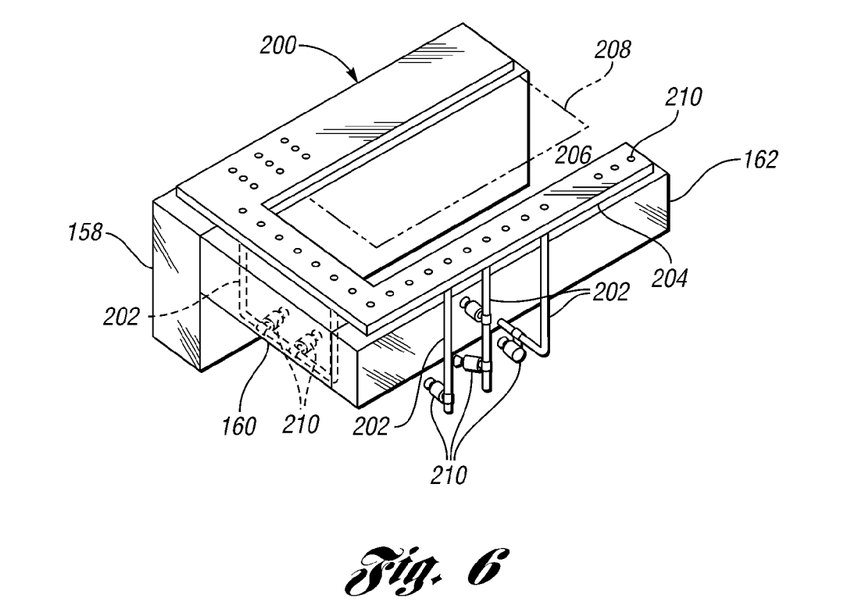
FIG. 6 depicts an example of a camera mounting fixture according to one embodiment of the present invention.

FIG. 6 depicts an example of a camera mounting fixture 200, which includes a number of substantially upright rods 202 for supporting a mounting member 204. The mounting member 204 defines an opening 206 for receiving at least a portion of the hood 208 of the main module and/or other components of the main and other modules. A number of threaded holes 210 are formed in mounting member 204 for mounting one or more cameras in a number of locations. Mounting clamps can be utilized to mount the camera to the mounting fixture. In at least one embodiment, the mounting clamps for mounting the cameras to the fixtures are Manfrotto Super Clamps without Stud #2915, available from Gruppo Manfrotto, S.r.l. of Italy. As shown in FIG. 6, mounting fixture 200 can be utilized to mount one or more cameras in mounting zones 158, 160 and 162. The mounting fixture also includes a number of clamps 210 attached to the rods 202 for attaching the mounting fixture 200 to fixed points on the vehicle model 100.

FIG. 6 depicts an example of a vehicle superstructure, i.e. mounting fixture 200, that can be utilized to mount one or more vehicle modules and camera fixtures. In at least one embodiment, the roof of vehicle model is supported by a superstructure, thereby separating the roof from the pillars of the vehicle model.

FIGS. 5a and 5b depict the placement of cameras 168 and 170 within zones 158 and 160, respectively. In at least one embodiment, the cameras are VICON SV Cameras and are 100×60×70 mm in size. Once mounted and calibrated, the cameras remain in a fixed position for the duration of a study and do not move relative to one another even by a few centimeters, according to one embodiment of the present invention. Therefore, the mounting fixture for the cameras remain stationary as the components of the vehicle model 100 move to change the vehicle configuration and the positioning of components. The mounting fixture for the cameras provides that the positions of the cameras are relatively stable when exposed to minor disturbances such as vibration or inadvertent bumping by a subject, while the mounting fixture is adjustable independent of the vehicle. This adjustability allows the cameras to be located at desired locations within the camera mounting zones 158, 160, 162, 164 and 166. The adjustability of the camera mounting fixtures can be continuous, meaning that the camera mounting fixtures allow the cameras to be mounted anywhere in the zones, not just at discrete locations. As depicted in FIGS. 5a and 5b, continuous mounting reference lines 172, 174, 176, 178 and 180 are shown for mounting zones 158, 160, 162, 164 and 166, respectively. In at least one embodiment, rod fixtures can be positioned at the mounting reference lines for mounting cameras.

Sightlines from the camera mounting locations to the occupant (both seated occupant and an occupant completing an ingress or egress motion) are clear of obstructions according to one embodiment. Structures other than elements of the vehicle model, such as support structures for the mounting fixture, are not placed in the camera mounting zones according to an embodiment of the present invention. In addition, any elements of the vehicle model within the zones can be designed to provide minimal obstruction for the camera sight lines. The position of the overhead camera can be such that the headliner armature and trim can be moved up to their highest position without obstruction from the camera. In at least one embodiment, the vehicle model does not include a roof such that additional camera sight lines can be accommodated.

As required, detailed embodiments of the present invention are disclosed herein. However, it is to be understood that the disclosed embodiments are merely exemplary of the invention that may be embodied in various and alternative forms. Therefore, specific functional details described herein are not to be interpreted as limiting, but merely as a representative basis for the claims and/or as a representative basis for teaching one of ordinary skill in the art to variously employ the present invention.

While the best mode for carrying out the invention has been described in detail, those familiar with the art to which this invention relates will recognize various alternative designs and embodiments for practicing the invention as defined by the following claims.

What is claimed:

1. A vehicle model comprising:
a main vehicle module and a secondary vehicle module, relatively positionable with respect to one another to obtain a plurality of configurations;
a subject platform located adjacent to, detached from, and integrated to function with the modules, and configured to vertically adjust between a plurality of positions for simulating ground outside a vehicle; and
a plurality of mounting zones, spaced apart and separate from the positionable main and secondary vehicle modules, configured to receive mounting fixtures supporting cameras that are integrated to function with the positionable main and secondary vehicle modules, the mounting fixtures adjustable independent of the positionable main and secondary vehicle modules,
wherein the mounting fixtures are continuous such that the cameras may be mounted to the fixtures in more than one position within the mounting zone, and wherein the cameras remain in a fixed position while components of the vehicle modules are repositioned and the subject platform is vertically adjusted.

2. The vehicle model of claim 1, wherein the mounting zones include at least a mounting zone adjacent to a right side of an occupant when the occupant is seated in the vehicle model.

3. The vehicle model of claim 1 wherein the mounting zones include at least a mounting zone adjacent to a left side of an occupant when the occupant is seated in the vehicle model.

4. The vehicle model of claim 1 wherein the mounting zones include at least a mounting zone in front of an occupant when the occupant is seated in the vehicle model, the zone in front of the occupant further being in front of a vehicle header.

5. The vehicle model of claim 1 wherein the mounting zones include at least an overhead mounting zone above an occupant when the occupant is seated in the vehicle model, the overhead mounting zone further configured to allow a camera mounted therein to have an unimpeded view of an occupant through an opening in a top of the vehicle model.

6. The vehicle model of claim 5, wherein an overhead mounting zone is configured to permit mounting of a camera such that a headliner and trim of the vehicle model can be moved up to a highest position without interference from the camera.

7. The vehicle model of claim 1 wherein the mounting zones include at least a footwell zone adjacent to a footwell of the vehicle model.

8. The vehicle model of claim 1, wherein the mounting zones include a left zone and a right zone, adjacent to a left side and a right side of a seated occupant, a front zone, in front of a header and forward of a seated occupant, an overhead zone, above a seated occupant and a footwell zone, adjacent to a footwell of the vehicle model.

9. The vehicle model of claim 1, further including a plurality of mounting rods, included in at least one mounting zone, configured to engage one or more mounting members for mounting one or more cameras in a plurality of possible locations within a mounting zone.

10. A method for modeling human interaction with a vehicle model comprising:
manipulating at least a first and second vehicle module, the modules being relatively positionable with respect to one another to obtain a plurality of module configurations;
manipulating a vertically adjustable subject platform adjacent to and detached from the at least first and second modules, the subject platform being positionable to obtain a plurality of subject platform configurations to simulate ground outside a vehicle;
positioning one or more cameras in one or more mounting fixtures independent of the first and second modules in a plurality of camera zones spaced apart and separate from the modules to capture occupant movement as an occupant enters and exits the vehicle model including the first and second modules;
integrating the one or more cameras to function with the first and second modules, wherein the cameras remain in a fixed position when manipulating the first and second modules and the subject platform;
for at least two of the plurality of module configurations, having a human enter, sit, and exit the vehicle model; and
capturing, using the one or more cameras, the motion of the human as the human enters, sits and exits the vehicle model.

11. The method of claim 10, wherein the mounting zones include at least a mounting zone adjacent to a right side of an occupant when the occupant is seated in the vehicle model.

12. The method of claim 10, wherein the mounting zones include at least a mounting zone adjacent to a left side of an occupant when the occupant is seated in the vehicle model.

13. The method of claim 10, wherein the mounting zones include at least a mounting zone in front of an occupant when the occupant is seated in the vehicle model, the zone in front of the occupant further being in front of a vehicle header.

14. The method of claim 10, wherein the mounting zones include at least an overhead mounting zone above an occupant when the occupant is seated in the vehicle model, the overhead mounting zone further configured to allow a camera mounted therein to have an unimpeded view of an occupant through an opening in a top of the vehicle model.

15. The method of claim 10, wherein the mounting zones include at least a footwell zone adjacent to a footwell of the vehicle model.

16. The method of claim 10, wherein the mounting zones include a left zone and a right zone, adjacent to a left side and a right side of a seated occupant, a front zone, in front of a header and forward of a seated occupant, an overhead zone, above a seated occupant and a footwell zone, adjacent to a footwell of the vehicle model.

17. A vehicle model comprising:
relatively positionable main and secondary vehicle modules;
a vertically adjustable subject platform adjacent to, detached from and integrated to function with the modules to simulate ground outside a vehicle; and
mounting zones independently adjustable, spaced apart and separate from the modules, each including continuous fixtures for cameras integrated to function with the modules and variably positionable within the respective zone, the cameras being fixed while module-components reposition and the platform adjusts.

* * * * *